(12) United States Patent
Luellau

(10) Patent No.: US 6,844,920 B2
(45) Date of Patent: Jan. 18, 2005

(54) EXPOSURE DEVICE AND METHOD FOR COMPENSATING OPTICAL DEFECTS

(75) Inventor: Friedrich Luellau, Voegelsen (DE)

(73) Assignee: Basys Print GmbH Systeme fuer die Druckindustrie, Biozenburg (DE)

(*) Notice: Subject to any disclaimer, the term of this patent is extended or adjusted under 35 U.S.C. 154(b) by 214 days.

(21) Appl. No.: 10/149,298

(22) PCT Filed: Mar. 8, 2001

(86) PCT No.: PCT/EP01/02591
§ 371 (c)(1),
(2), (4) Date: Sep. 16, 2002

(87) PCT Pub. No.: WO01/69320
PCT Pub. Date: Sep. 20, 2001

(65) Prior Publication Data
US 2003/0077089 A1 Apr. 24, 2003

(30) Foreign Application Priority Data
Mar. 11, 2000 (DE) .......................... 100 12 017

(51) Int. Cl.⁷ .................. G03B 27/54; G02B 27/42; G02B 26/00
(52) U.S. Cl. .................... 355/67; 355/53; 359/237; 359/291
(58) Field of Search ................ 359/237, 238, 359/291, 637; 355/53, 67; 430/5, 20, 30; 250/548

(56) References Cited

U.S. PATENT DOCUMENTS

| | | | |
|---|---|---|---|
| 5,369,499 A | 11/1994 | Yip | 358/406 |
| 5,473,409 A | * 12/1995 | Takeda et al. | 355/53 |

FOREIGN PATENT DOCUMENTS

| | | |
|---|---|---|
| DE | 38 13 398 A | 11/1989 |
| DE | 198 45 821 A | 6/1997 |
| DE | 197 03 063 A | 8/1998 |
| EP | 0 875 386 A | 11/1998 |
| EP | 0 953 877 A | 11/1999 |

* cited by examiner

Primary Examiner—Georgia Epps
Assistant Examiner—Jack Dinh
(74) Attorney, Agent, or Firm—Michael J. Striker

(57) ABSTRACT

An exposure device for exposing a projection of an electronically stored artwork pattern onto a substrate, in particular a printing plate (1), with image processing electronics (2) that can store the image data, with a light modulator (7) that can be electronically controlled by the image processing electronics (2), in particular an LCD display (7) or a micro-mirror device, with an illuminating device (8, 9) for illuminating the light modulator (7), and with a projection lens (11) for projecting the light modulator (7) onto the substrate (1), is improved according to the invention in that the image processing electronics (2) include a compensation device (4, 5) to compensate for optical defects and/or tolerances in the beam path of the exposure device.

8 Claims, 1 Drawing Sheet

EXPOSURE DEVICE AND METHOD FOR COMPENSATING OPTICAL DEFECTS

BACKGROUND OF THE INVENTION

The invention relates to an exposure device for exposing a projection of an electronically stored artwork pattern onto a substrate, in particular a printing plate, with image processing electronics that can store the image data, with a light modulator that can be electronically controlled by the image processing electronics, in particular an LCD display or a micro-mirror device, with an illuminating device for illuminating the light modulator and with a projection lens for projecting the light modulator onto the substrate. The invention also relates to a method for compensating for optical defects and/or tolerances in the beam path of such an exposure device.

An exposure device of this kind, which is used to expose printing plates with ultraviolet light, is known from DE 195 45 821 A1, for example. In this instance, the artwork pattern to be projected is broken down into partial images by a computer and the partial images are cast one after the other onto an electronically controllable light modulator, for example an LCD display through which radiation passes or a micro-mirror device. The exposure device is then gradually moved across the printing plate to be exposed, the light modulator being respectively triggered with the appropriate partial image. Micro-mirror devices, also referred to as digital mirror devices or DMD for short, are comprised of an arrangement of tiny mirrors with edge lengths of a few micrometers on the surface of an electronic chip, in which each individual mirror can be individually tilted by being electronically triggered so that an incident light beam can either be directed into a projection objective or directed past it, depending on the tilting angle of the mirror.

Due to optical defects and tolerances in the beam path of the exposure device, the projection exposed on the substrate to be exposed, in particular a printing plate, deviates from the electronic artwork pattern. In particular, shadows are produced at the edges and in the corners of the individual images.

SUMMARY OF THE INVENTION

The object of the current invention, therefore, is to disclose an exposure device of the type mentioned at the beginning as well as a method, with which the optical defects and/or tolerances in the beam path of the exposure device can be compensated for.

The object is achieved according to the invention in the above-mentioned exposure device in that the image processing electronics include a compensation device to compensate for optical defects and/or tolerances in the beam path of the exposure device. This electronic compensation device has the advantage that it can be produced simply and inexpensively, essentially in a software-based manner because image processing electronics, preferably in the form of a computer, are generally already present and therefore do not entail any additional expenses.

A preferred embodiment of the invention provides that the compensation device can modulate the total quantity of incident light striking any point of the substrate to be exposed during the exposure process. The action of the exposure, i.e. the photochemical action finally produced on the substrate to be exposed, which in a photographic projection, corresponds to the luminosity of each respective point, essentially depends on the total quantity of incident light, which in the simplest case of a constant light intensity, is the product of the intensity and the exposure time. If each point of the substrate to be exposed can be individually modulated, then this permits a virtually complete compensation down to all of the details of projection.

In one embodiment of the invention, during the exposure process, a locus-dependent intensity modulation of the stored artwork pattern can be provided with an electronically stored gray mask. The gray mask is comprised of a set of multiplication factors for each individual image point. During the exposure, the intensity of each individual image point that the light modulator allows to pass through is increased or decreased according to the stored multiplication factor and therefore the luminosity differences unintentionally generated by defects and/or tolerances of the exposure- and/or projection lens can be compensated for. With the use of an LCD display as a light modulator, this can take place by virtue of the fact that the rotation angle of the circularly polarized light is changed through appropriate control of the LCD display.

In a micro-mirror device, an intensity modulation is not possible since the micromirrors can only be set to two fixed tilting positions so that the intensity of an individual point can only be switched to 100% on or completely off. A modulation of the total amount of incident light striking an individual point during the substrate exposure can only be executed by varying the "ON time" of each individual micro-mirror. Therefore, a modified embodiment of the invention provides that in order to achieve a locus-dependent light quantity modulation, the ON times of individual pixels of the light modulator during the exposure process can be varied in accordance with an electronically stored gray mask.

In order to simply generate a suitable gray mask, which compensates not only for all defects of the exposure beam path, but also for the influence of the printing plate, its gamma curves, the developer used, and similar factors that can influence the luminosity distribution, a modification of the method according to the invention proposes that in order to generate the electronically stored gray mask, a test exposure of a printing plate is executed, in which all pixels of the light modulator are triggered with an average gray value, and that after the development of the printing plate, the luminosity distribution produced on the printing plate is input into the image processing electronics, which generate the electronic gray mask based on this information, preferably by inverting the gray shades of the individual pixels.

The luminosity distribution of the developed test printing plate is input into the image processing electronics simply by scanning the printing plate with an electronic camera or an electronic scanner; the data of the consequently digitized gray values are simply input into the image processing electronics and are suitably converted therein to the digital values of the gray mask and stored.

In the production of the electronic gray mask, the gradation of the printing plate in connection with the respective exposure spectrum used and the respective developer used can be precisely taken into consideration; all other influences on the luminosity distribution can be "calculated out". Such additional factors can, for example, be traced back to the exposure intensity, the exposure time, the development duration, the composition, temperature, concentration, depletion (age), and impurities of the developer, or to the temperature, age, composition, or pre-treatment of the light-sensitive coating of the printing plate. All conceivable influences on the luminosity distribution in the printing plate exposure can be compensated for by means of the method according to the invention through the electronic gray mask generated in a single calibration run.

Exemplary embodiments of the invention will be explained in detail below in conjunction with the drawing.

DESCRIPTION OF THE PREFERRED EMBODIMENTS

Figure 1:
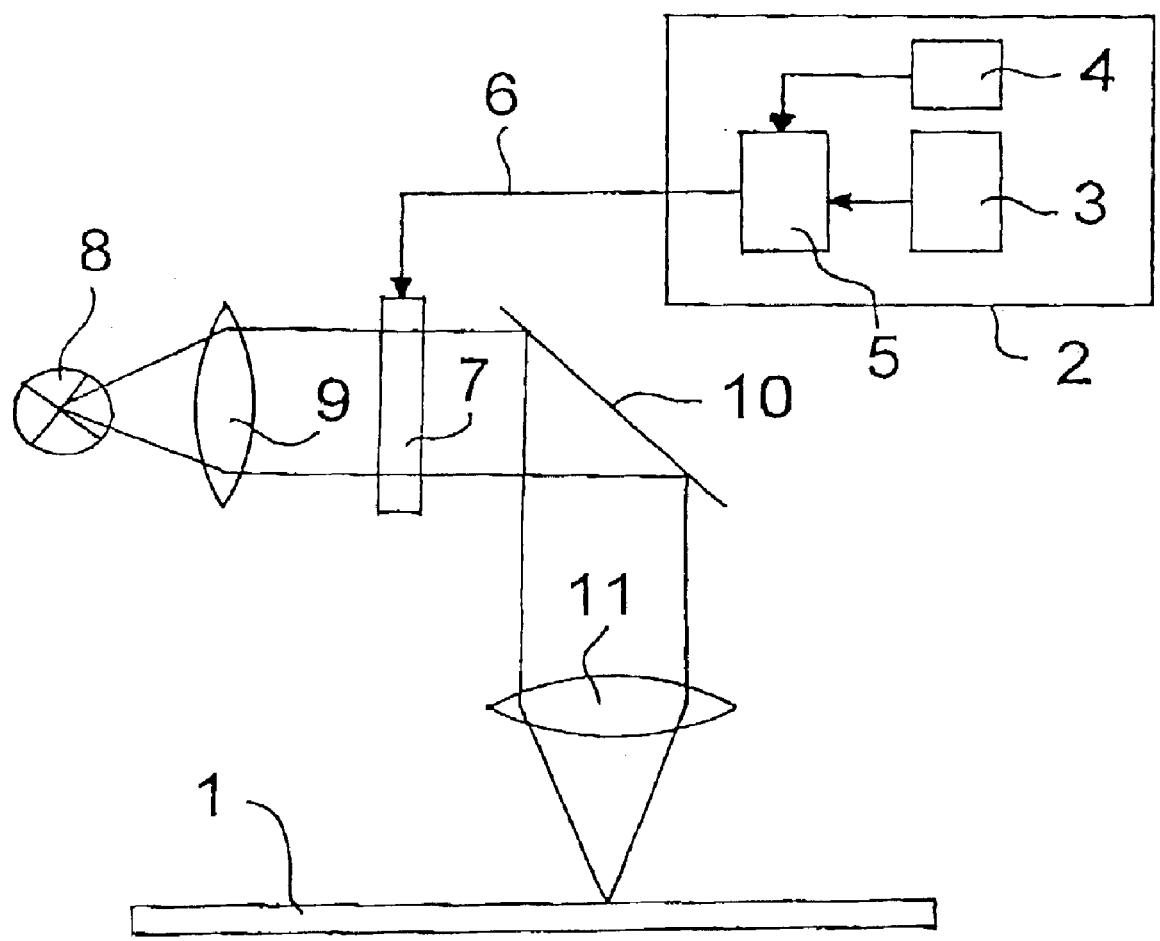
FIG. 1 is a schematic representation of an exposure device according to the invention.

The artwork pattern to be projected onto a printing plate 1 is stored in an image memory 3 in a computer that serves as the processing electronics 2. An overlay file is stored in the overlay memory 4 and is used to generate an electronic gray mask. An image from the image memory 3 or a partial image of the overall image is loaded into a compensator 5 and is corrected pixel by pixel with the overlay data from the overlay memory 4, i.e. the control data provided for controlling the light intensity and/or the duration of the exposure of each individual pixel are modified through multiplication with the correction values of the overlay file in accordance with the desired correction. As a rule, their value is increased or decreased. Then, the corrected image or partial image travels via the data line 6 to the light modulator, in this case an LCD display through which radiation passes, in whose focal plane the actual image is produced.

An illumination device for illuminating the light modulator 7 is comprised of a light source 8 and a condenser 9. The light emanating from the light source 8 is concentrated onto the light modulator 7 by a condenser 9. After the modulation in the light modulator 7, the modulated light strikes a mirror 10, which deflects a beam path downward into a projection lens 11. The projection lens 11 projects the focal plane of the light modulator 7 onto the printing plate 1.

In a modified embodiment, the mirror 10 can be replaced by a micro-mirror device, which is then used as the light modulator. In this case, the LCD display 7 can be eliminated.

The defects in the beam path of the exposure device, which are caused by optical defects in the illumination device 8, 9, the projection lens 11, or also in other optical elements 7, 10, are compensated for by means of the electronic gray mask described above so that a largely error-free and, in terms of luminosity reproduction, uniform projection of the electronic artwork pattern is produced on the printing plate 1.

What is claimed is:

1. An exposure device for exposing a projection of an electronically stored artwork pattern onto a substrate, in particular a printing plate (1), with image processing electronics (2) that can store the image data, with a light modulator (7) that can be electronically controlled by the image processing electronics (2), in particular an LCD display (7) or a micro-mirror device, with an illuminating device (8, 9) for illuminating the light modulator (7) and with a projection lens for projecting the light modulator (7) onto the substrate (1), characterized in that the image processing electronics (2) include a compensation device (4, 5) to compensate for optical defects and/or tolerances in the beam path of the exposure device, and the compensation device (4, 5) can modulate the total quantity of incident light striking any point of the substrate (1) to be exposed during the exposure process.

2. An exposure device for exposing a projection of an electronically stored artwork pattern onto a substrate, in particular a printing plate (1), with image processing electronics (2) that can store the image data, with a light modulator (7) that can be electronically controlled by the image processing electronics (2), in particular an LCD display (7) or a micro-mirror device, with an illuminating device (8, 9) for illuminating the light modulator (7) and with a projection lens for projecting the light modulator (7) onto the substrate (1), characterized in that the image processing electronics (2) include a compensation device (4, 5) to compensate for optical defects and/or tolerances in the beam path of the exposure device, and during the exposure process, a locus-dependent intensity modulation of the stored artwork pattern can be provided with an electronically stored gray mask.

3. An exposure device for exposing a projection of an electronically stored artwork pattern onto a substrate, in particular a printing plate (1), with image processing electronics (2) that can store the image data, with a light modulator (7) that can be electronically controlled by the image processing electronics (2), in particular an LCD display (7) or a micro-mirror device, with an illuminating device (8, 9) for illuminating the light modulator (7) and with a projection lens for projecting the light modulator (7) onto the substrate (1), characterized in that the image processing electronics (2) include a compensation device (4, 5) to compensate for optical defects and/or tolerances in the beam path of the exposure device, and in order to achieve a locus-dependent light modulation, the ON times of individual pixels of the light modulator (7) during the exposure process can be varied in accordance with an stored gray mask.

4. A method for compensating for optical defects and/or tolerances in the beam path of an exposure device, in which a projection of an artwork pattern stored in a set of image processing electronics (2) is projected onto a substrate, in particular a printing plate (1), in which a light modulator that is controlled by the image processing electronics (2), in particular an LCD display (7) or a micro-mirror device, is illuminated by means of an illuminating device (8, 9), and is projected onto the substrate (1) to be exposed by means of a projecting lens (11), characterized in that the total quantity of incident light striking any point of the substrate (1) during the exposure process is modulated in such a way that the exposure differences on the substrate to be exposed, which are due to optical defects and/or tolerances in the beam path, are compensated for.

5. The method according to claim 4, characterized in that during the exposure process, a locus-dependent intensity modulation of the stored artwork pattern takes place with an electronically stored gray mask.

6. The method according to claim 4, characterized in that in order to achieve a locus-dependent light quantity modulation, the ON times of individual pixels of the light modulator during the exposure process are varied in accordance with an electronically stored gray mask.

7. The method according to claim 4, characterized in that in order to generate the electronically stored gray mask, a test exposure of a printing plate (1) is executed, in which all pixels of the light modulator (7) are triggered with an average gray value, and that the luminosity distribution produced on the printing plate (1) after the development of the printing plate (1) is input into the image processing electronics (2), which generate the electronic gray mask based on this information, preferably by inverting the gray shades of the individual pixels.

8. The method according to claim 7, characterized in that an electronic camera or a scanner is used to input the luminosity distribution of the developed test printing plate (1).

* * * * *

UNITED STATES PATENT AND TRADEMARK OFFICE
CERTIFICATE OF CORRECTION

PATENT NO. : 6,844,920 B2
APPLICATION NO. : 10/149298
DATED : January 18, 2005
INVENTOR(S) : F. Luellau It is certified that error appears in the above-identified patent and that said Letters Patent is hereby corrected as shown below:

Title Page

Sec. 73- Delete "Biozenburg" and substitute --Boizenburg--

Signed and Sealed this

Twenty-first Day of August, 2007

JON W. DUDAS
*Director of the United States Patent and Trademark Office*